(12) United States Patent
Koiwa

(10) Patent No.: US 7,606,012 B2
(45) Date of Patent: Oct. 20, 2009

(54) SEMICONDUCTOR DEVICE AND DESIGNING METHOD FOR THE SAME

(75) Inventor: Sumio Koiwa, Chiba (JP)

(73) Assignee: Seiko Instruments Inc. (JP)

( * ) Notice: Subject to any disclaimer, the term of this patent is extended or adjusted under 35 U.S.C. 154(b) by 412 days.

(21) Appl. No.: 11/374,818

(22) Filed: Mar. 14, 2006

(65) Prior Publication Data

US 2006/0221520 A1    Oct. 5, 2006

(30) Foreign Application Priority Data

Mar. 15, 2005    (JP) .............................. 2005-072263

(51) Int. Cl.
    *H02H 3/22*    (2006.01)
(52) U.S. Cl. ........................................ 361/56; 361/111
(58) Field of Classification Search .................. 361/56, 361/111; 257/355–361
    See application file for complete search history.

(56) References Cited

U.S. PATENT DOCUMENTS

| | | | | |
|---|---|---|---|---|
| 5,656,530 A * | 8/1997 | Leary | .......................... | 438/639 |
| 6,246,566 B1 * | 6/2001 | Glenn | .......................... | 361/220 |
| 6,316,734 B1 * | 11/2001 | Yang | .......................... | 174/256 |
| 7,291,918 B2 * | 11/2007 | Tsai et al. | .................... | 257/758 |

\* cited by examiner

*Primary Examiner*—Danny Nguyen
(74) *Attorney, Agent, or Firm*—Adams & Wilks

(57) ABSTRACT

A semiconductor device has a semiconductor circuit provided on a semiconductor substrate. The semiconductor circuit has a source, a drain, a gate and a wiring connected to one of the source, the drain and the gate. Conductors for electrostatic discharge protection are connected to one of a ground line and a power supply line and are disposed over a region of the semiconductor circuit not occupied by the wiring. A ratio of a total area of the conductors disposed over the semiconductor circuit to an area of a chip occupied by the semiconductor circuit is 40% or more.

10 Claims, 6 Drawing Sheets

※ Areal ratio conductor = $\dfrac{\text{Area of conductor}}{\text{Area of chip}}$ ※ Areal ratio = $\dfrac{\text{Area of conductors connected to the GND}}{\text{Area of conductors connected to the VDD}}$

| Level | ESD Tolerance |
|---|---|
| 1 | 2 k V |
| 2 | 4 k V |
| 3 | 8 k V |
| 4 | 1 5 k V |

SEMICONDUCTOR DEVICE AND DESIGNING METHOD FOR THE SAME

BACKGROUND OF THE INVENTION

1. Field of the Invention

The present invention relates to a semiconductor device having electrostatic discharge (ESD) protecting means, and more particularly, to a semiconductor device having electrostatic discharge protecting means applied to a CMOS circuit.

2. Description of the Related Art

A semiconductor element such as a transistor included in a semiconductor circuit constituting a semiconductor device is sometimes seriously damaged in an electrostatic discharge event. A main source of an electrostatic discharge exposed to the semiconductor circuit is a human body ("human body model", abbreviated as HBM), and the discharge from the human body generates current with a peak of several amperes to the semiconductor circuit for about 100 nanoseconds.

The second source of the discharge is a discharge from a metal object ("machine model", abbreviated as MM), and this source quite possibly induces a transient in which a rise time is significantly larger than that of the electrostatic discharge in the HBM.

The third source comes from "charge device model" (CDM). In this model, a semiconductor element and the like themselves, which are included in the semiconductor circuit, are charged. In order to protect the semiconductor device from the electrostatic discharge, the charged electricity, which causes the discharge, should be discharged to the ground.

As all the devices are obliged to reduce dimensions thereof owing to demands for a faster operation speed, a lower operation voltage, a larger packing density, and less cost, protection from electrostatic discharge phenomena in the semiconductor circuit has become more important.

A description will be made on a semiconductor device including conventional electrostatic discharge protecting means based on FIG. 6. FIG. 6 shows the semiconductor device including the conventional electrostatic discharge protecting means (for example, refer to JP 5-180899 A).

In FIG. 6, the most common protecting means employed in a semiconductor circuit of a metal-oxide semiconductor (MOS) is a parasitic bipolar transistor associated with an NMOS transistor 117 formed on a semiconductor substrate 110. A drain 112 of the NMOS transistor 117 is connected to an input/output terminal 120 connected to a semiconductor circuit 121 to be protected, which is included in the semiconductor device, and a source 113 and gate 111 thereof are grounded. A protection level or a breakdown threshold value can be set by changing the gate length of the NMOS transistor 117 from the drain 112 to the source 113 below the gate 111 of the NMOS transistor 117. Under a stress condition, the parasitic bipolar transistor of the NMOS transistor 117 provides a dominant current conduction path between the to-be-protected input/output terminal 120 and a ground line 118 (the ground). The parasitic bipolar transistor operates in a snapback region when the polarity of a ground stress event is positive, and operates in forward-bias condition of a diode when the polarity is negative. Specifically, as long as the snapback region and forward-bias characteristics of the parasitic bipolar transistor operate normally, such an electrostatic discharge stress applied to the input/output terminal 120 is discharged, and accordingly, the semiconductor circuit 121 does not break. Since normal operation of the parasitic bipolar transistor in the snapback region or forward-bias condition assures the discharge of an electrostatic discharge stress applied to the input/output terminal 120, no breakdown occurs in the semiconductor circuit 121.

A main breakdown mechanism observed in an NMOS protection device operating as the parasitic bipolar transistor under such a snapback condition is a start of a second breakdown. The second breakdown is a phenomenon which always induces thermal runaway in the device when decrease of an impact ionization current is cancelled by thermal generation of carriers. The second breakdown starts in the device under the stress as a result of self-heating. It is known that the peak temperature of the NMOS device at which the second breakdown takes place rises together with the level of stress current.

The brief description has been made above of technology about electrostatic discharge in the conventional model, and the electrostatic discharge phenomenon and the protection method for the semiconductor circuit are described, for example, in JP 5-180899 A and "IEC standard, IEC-61000-4-2".

In recent years, a new electrostatic discharge model has attracted attention. This electrostatic discharge model is called "air discharge model", and this breakdown model assumes an electrostatic breakdown caused by a direct discharge from a charged body to an IC package.

FIG. 7 shows a simplified view of an electrostatic discharge measurement equivalent circuit for the air discharge model. In FIG. 7, static electricity is charged from a power supply 100 through a resistor 103 to a capacitance 105 when a switch 101 is on and a switch 102 is off. By putting off the switch 101 and putting on the switch 102, the static electricity charged in the capacitance 105 is applied through a resistor 104 to a circuit board 106 implementing a semiconductor circuit therein. A measurement method of this model is described in "IEC standard, IEC-61000-4-2".

FIG. 8 shows a standard of an air discharge model in the IEC. Demand for Level 4 electrostatic discharge tolerance from the market increases the importance of an electrostatic discharge protection element.

The above-described conventional semiconductor device has the following problems. The electrostatic discharge protection in the HMB model, the MM model, and the CDM model can be made by the methods disclosed in JP 5-180899 A and "IEC standard, IEC-61000-4-2". Insufficiency of the methods against the air discharge model, however, makes it difficult to respond to the market demand for Level 4 strength.

Though increase in the area of an electrostatic discharge protection element can resolve the above-described problem, the larger electrostatic discharge protection element and the increase in the area of the chip result in the following problem.

Connection of passive elements such as a resistor, a coil, and a capacitance to the electrostatic discharge protection element can yield higher electrostatic discharge voltage though, resulting not only possible increase in the chip area but also decrease in the CR time constant, which degrade the performance of the semiconductor device.

Further, the electrostatic discharge stress in the air discharge model is applied not only to the input/output terminal but also directly to the semiconductor circuit 121 in the inside of the chip. At this time, a problem occurs that the conventional method can respond to the application of the electrostatic discharge stress to the input/output terminal, but not to the electrostatic discharge stress applied directly to the internal semiconductor circuit 121 of the chip.

SUMMARY OF THE INVENTION

The present invention has been made in view of the points as described above. It is an object of the present invention to provide a semiconductor device including electrostatic discharge protecting means resistant to the air electrostatic discharge without increase in manufacturing cost or degradation in the performance of the semiconductor device.

In order to solve the above-described problem, the present invention has adopted the following means.

(1) A semiconductor device, comprising: a semiconductor circuit provided on a semiconductor substrate; and conductors for electrostatic discharge protection disposed over the semiconductor circuit, and having a ratio of a total area of the conductors disposed over the semiconductor circuit to an area of a chip occupied by the semiconductor circuit being 40% or more.

(2) A semiconductor device according to (1) which includes electrostatic discharge protection means, in which the conductors are made of metal.

(3) A semiconductor device according to (1) which includes electrostatic discharge protection means, some of the conductors are a conductor connected to a power supply line, and the rest of the conductors are connected to a ground line.

(4) A method of designing a semiconductor device including electrostatic discharge protection means, including: providing a plurality of conductors for protecting a semiconductor element included in the semiconductor circuit from an electrostatic discharge breakdown, on an upper surface of a semiconductor circuit formed on a semiconductor substrate; connecting a part of the conductors to a power supply line to use the part of the conductors as VDD protection conductors, and connecting the protection conductors which are not connected to the power supply line to a ground line to use the protection conductors as GND protection conductors; and adjusting a ratio of a total area of the VDD protection conductors to a total area of the GND protection conductors to determine the strength for an ESD.

In the semiconductor device including the electrostatic discharge protecting means according to the present invention, arranging conductors over the semiconductor circuit consisting of semiconductor devices on the semiconductor substrate causes the application of the electrostatic discharge stress in the air discharge model to the conductors, protecting the application of the electrostatic discharge stress to the semiconductor circuit and permitting the improvement in the electrostatic discharge strength without increase in the chip area or degradation in the performance of the semiconductor device. In the semiconductor device including the electrostatic discharge protecting means according to the present invention, use of the same metal for the wirings as the conductors can prevent the increase in manufacturing steps.

Further, the conductors are connected to the optimum lines in response to an electrostatic discharge protection capability of the semiconductor device, thus making it possible to constitute a semiconductor device including electrostatic discharge protecting means having a good overload tolerance for the electrostatic discharge.

Further, connecting the conductors to the optimum lines according to the electrostatic discharge protection capability of the semiconductor device enables the constitution of a semiconductor device including electrostatic discharge protecting means having sufficient electrostatic discharge strength.

Then, 40% or more of the ratio of the area of the conductors arranged on the semiconductor circuit disposed on a chip (semiconductor substrate) to the area of the chip (semiconductor substrate) can not only provide a semiconductor device including electrostatic discharge protecting means with sufficient efficiency but also permit stable manufacturing of the conductors.

As described above, according to the present invention a semiconductor device having high-performance electrostatic discharge protecting means can be realized without increase in manufacturing cost.

DETAILED DESCRIPTION OF THE PREFERRED EMBODIMENT

A description will be made below of an embodiment of the present invention.

Figure 1:
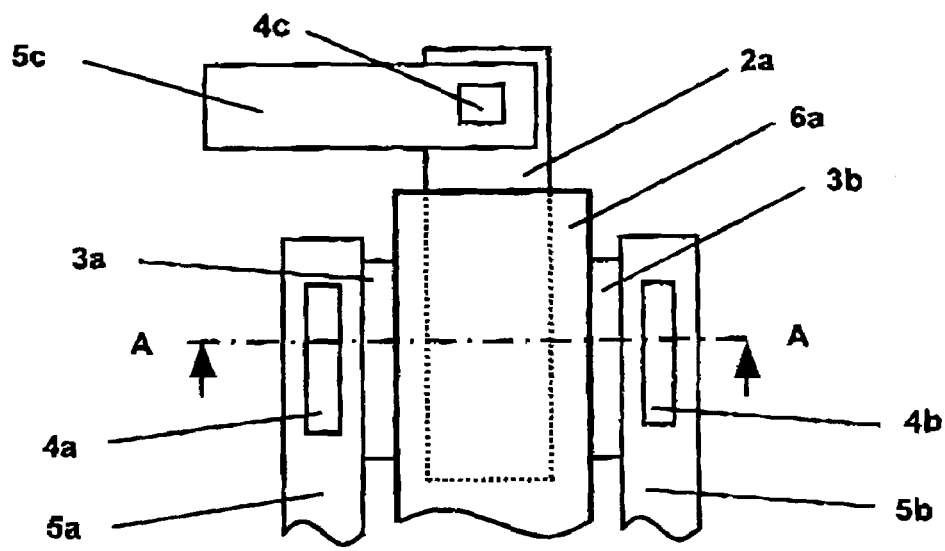
FIG. 1 is a schematic plan view showing a first embodiment of a semiconductor device including electrostatic discharge protecting means of the present invention.
Figure 2:
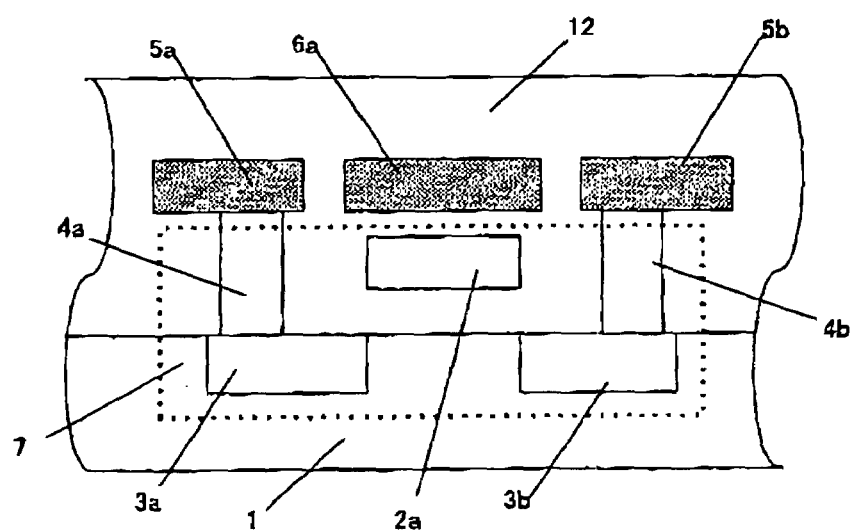
FIG. 2 is a cross-sectional view of the semiconductor device along a line A-A of FIG. 1.

FIG. 1 is a schematic plan view showing a first embodiment of a semiconductor device including electrostatic discharge protecting means of the present invention. FIG. 2 is a schematic cross-sectional view of the semiconductor device when viewed from a plain indicated by a line A-A shown in FIG. 1. In this drawing, a contact and a wiring which are connected to a gate of a MOS transistor 7 are omitted.

In FIGS. 1 and 2, a semiconductor device circuit, for example, a MOS transistor 7, is formed on a semiconductor substrate 1 with an impurity concentration in which a resistivity is 1 Ωcm to 20 Ωcm, and the MOS transistor 7 is composed of a diffusion layer 3a serving as a source, a diffusion layer 3b serving as a drain, and polycrystalline silicon 2a serving as a gate. Wirings 5a, 5b, and 5c connected to the diffusion layers 3a and 3b and the polycrystalline silicon 2a are formed of aluminum, for example, to which silicon is added for preventing a spike, and are connected through contacts 4a, 4b, and 4c to the diffusion layers 3a and 3b and the polycrystalline silicon 2a. On the MOS transistor 7, a conductor 6a formed of aluminum, for example, to which silicon is added for preventing the spike, is disposed against the wiring 5a to have a space larger than the minimum dimension defined by the design rule. At this time, simultaneous formation of the wirings 5a, 5b, and 5c and the conductor 6a can avoid additional manufacturing steps.

Figures 7, 8:
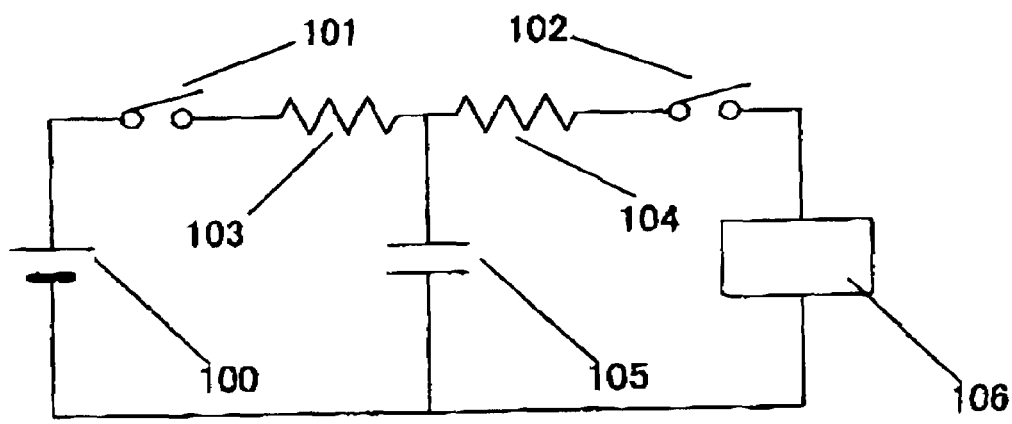
FIG. 7 is a simplified view of an electrostatic discharge measurement equivalent circuit of the air discharge model.
FIG. 8 is a table for levels in the air discharge model in the IEC standard.

A description will be made below of a phenomenon at the time when an electrostatic discharge test of the air discharge model shown in FIG. 7 is performed by using the semiconductor device including the electrostatic discharge protecting means of the present invention, which has the above-described configuration, for example, while referring to a semiconductor circuit including two MOS transistors 7a and 7b shown in FIG. 3.

Figure 3:
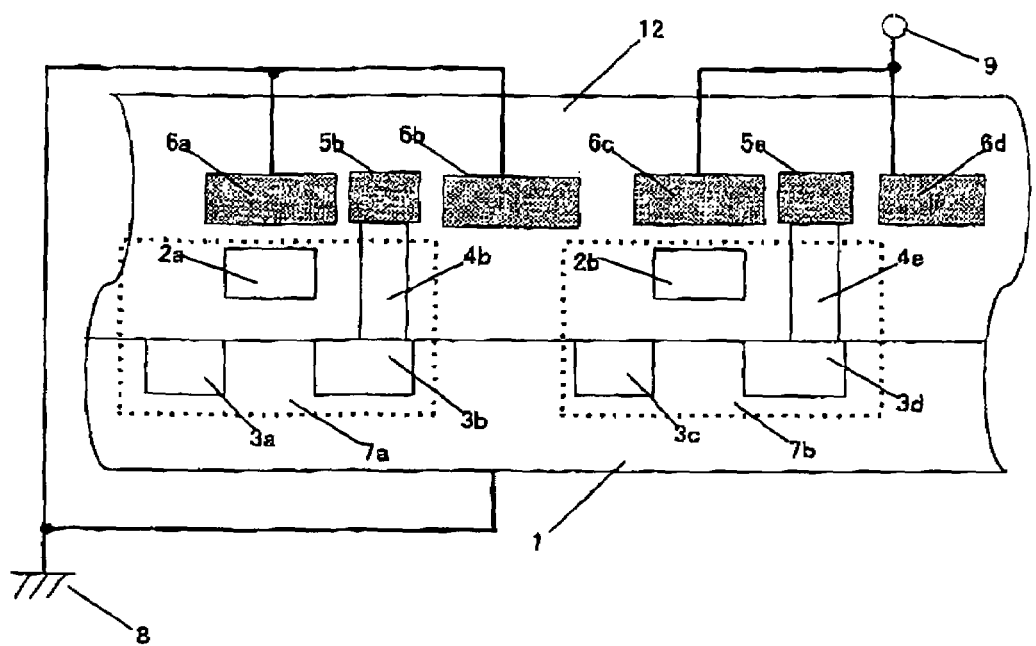
FIG. 3 is a schematic view of the first embodiment of the semiconductor device at a time of an electrostatic discharge test.
Figure 4:
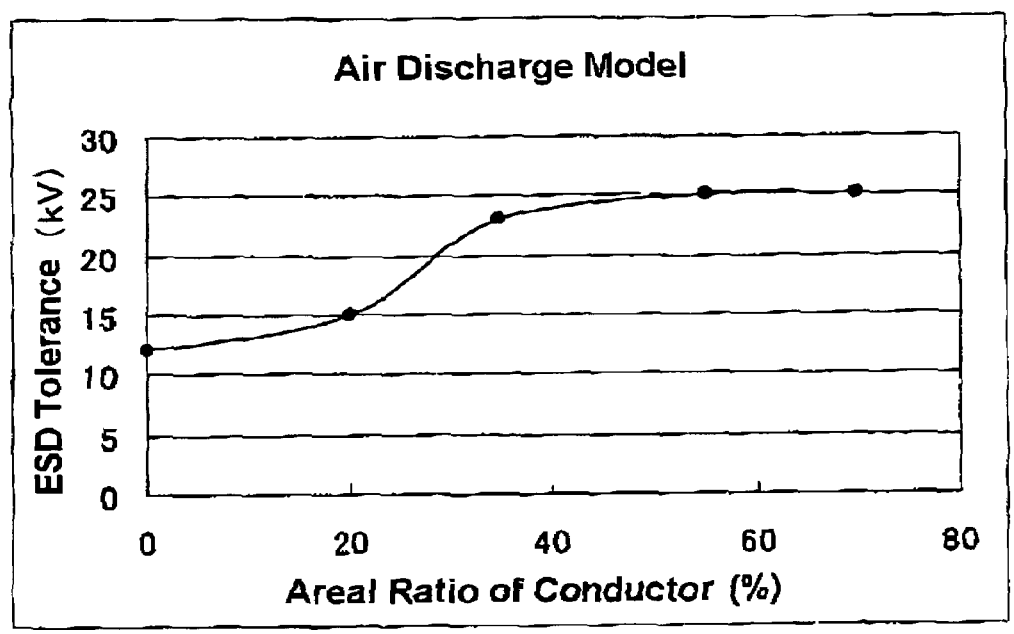
FIG. 4 is a graph showing a relationship between areal ratio of conductor and tolerance for an electrostatic discharge in an air discharge model in the semiconductor device.

In FIG. 3, input/output terminals of the semiconductor circuit, which do not directly relate to the present invention, are omitted. When the electrostatic discharge test has been performed, an electrostatic discharge stress is applied to the semiconductor circuit. The electrostatic discharge stress owing to an air discharge, which is applied to the semiconductor circuit, is not only applied to the input/output terminal but may also be applied to the wirings of the semiconductor circuit, which are not connected to the input/output terminal. The electrostatic discharge stress applied to the input/output terminal is released through an electrostatic discharge protection element of the conventional art, which is connected to the input/output terminal as in the HBM model or the MM model. Meanwhile, the electrostatic discharge stress applied to the wirings of the semiconductor circuit without passing through the input/output terminal is absorbed by the conductors 6a, 6b, 6c, and 6d, and is released to a ground line 8 and a power supply line 9. From the above, the release of the electrostatic discharge stress applied to the portions other than the input/output terminal, through the conductors 6a to 6d to the ground line 8 or the power line 9, prevents the application of the electrostatic discharge stress to the MOS transistors 7a and 7b, permitting a sufficient tolerance against electrostatic discharge stress in the air discharge model. At this time, all the electrostatic discharge stress applied to the portions other than the input/output terminal is not applied to the conductors 6a to 6d, and an amount of the stress applied thereto is determined by an areal ratio of the conductors with respect to the semiconductor circuit. FIG. 4 shows a relationship between the areal ratio of the conductors 6a to 6d with respect to a chip area and the tolerance for the electrostatic discharge in the air discharge model. In FIG. 4, it can be observed that setting the areal ratio of the conductors at 40% or more makes it possible to obtain stable and high tolerance for the electrostatic discharge. By setting the areal ratio of the conductors at 40% or more, most of the electrostatic discharge stress applied to the chip is applied to the conductors 6a to 6d, preventing the electrostatic discharge stress from applying to the MOS transistor 7 formed on the semiconductor substrate 1 and making it possible to obtain a loading effect in a step for forming the conductors 6a to 6d, specifically, at the time of etching for patterning the conductors 6a to 6d as well.

Figure 5:
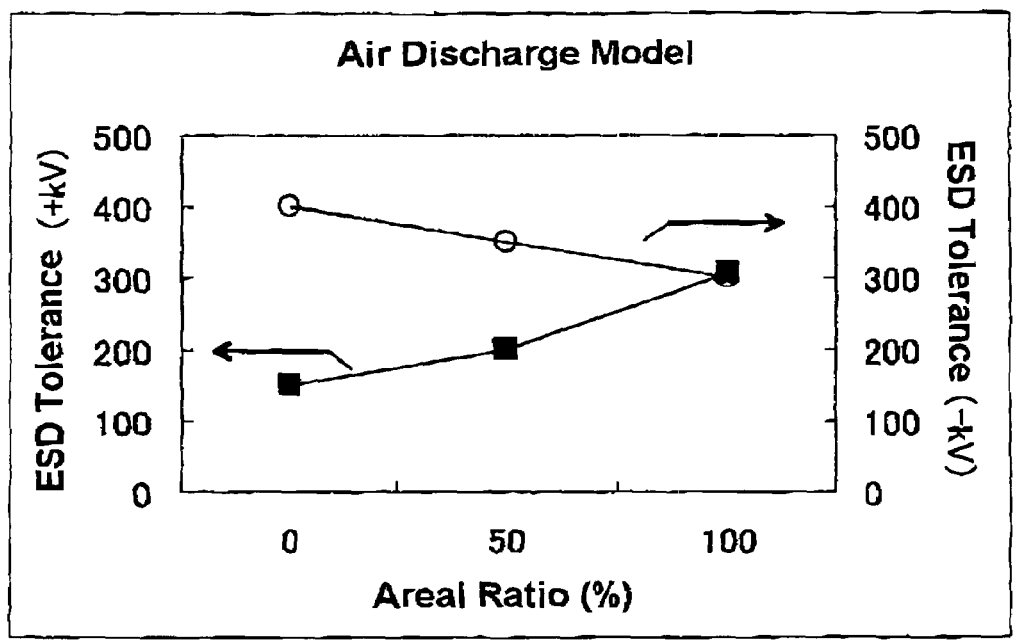
FIG. 5 is a graph showing polarity dependencies of tolerance for the electrostatic discharge to areal ratio in the air discharge model in the semiconductor device.
Figure 6:
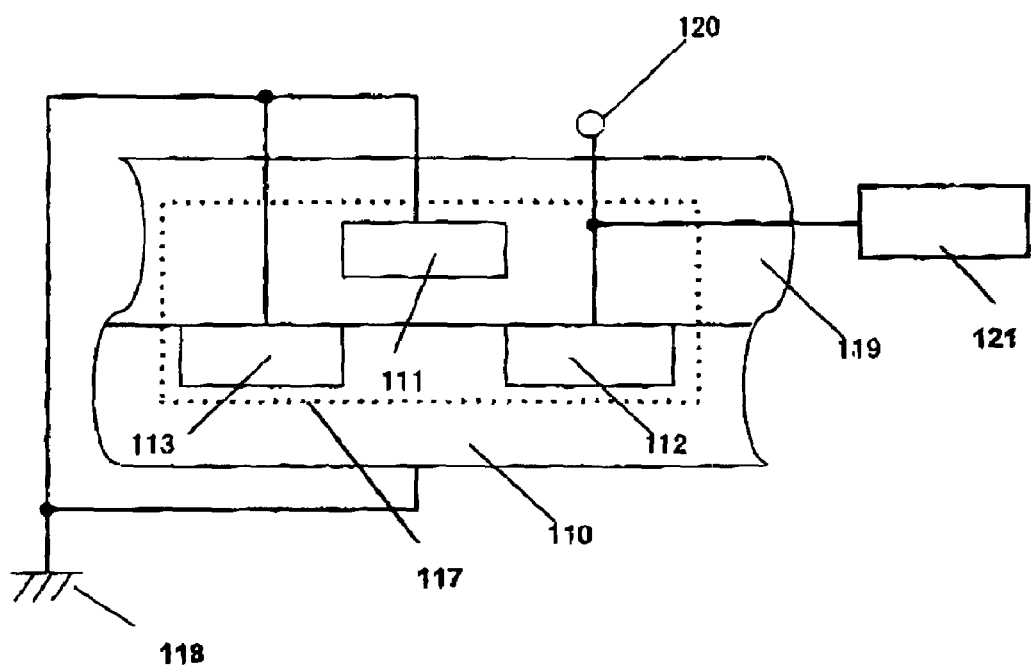
FIG. 6 is a cross-sectional view showing a semiconductor device including conventional electrostatic discharge protecting means.

Further, since the semiconductor device including the electrostatic discharge protecting means of the present invention includes the conductors 6a to 6d connected to the round line 8, and the conductors 6a to 6d connected to the power supply line 9, the semiconductor device can control the tolerance for the electrostatic discharge in the air discharge model. FIG. 5 is a graph showing polarity dependencies of the tolerance for the electrostatic discharge in the air discharge model in the semiconductor device including the electrostatic discharge protecting means of the present invention. Referring to FIG. 5A, description will be made below of the reason why the semiconductor device including the electrostatic discharge protecting means of the present invention can control the tolerance for the electrostatic discharge.

Connection of only the power supply line 9 to the conductors 6a to 6d makes the potential difference between the electrostatic discharge stress of the positive polarity and the power supply line 9 smaller than that between the electrostatic discharge stress of the negative polarity and the power supply line 9, thus making the current induced by the negative polarity electrostatic discharge stress easy to flow than that induced by the positive polarity electrostatic discharge stress. Accordingly, the tolerance for the electrostatic discharge of the negative polarity becomes larger than that for the electrostatic discharge of the positive polarity. In a case where the conductors 6a to 6d are connected to either the ground line 8 or the power supply line 9, the tolerance for the electrostatic discharge is changed depending on potentials of the lines connected to the conductors 6a to 6d. Accordingly, at the time of designing the semiconductor circuit, it has been necessary to select whether the conductors 6a to 6d are to be connected to the ground line 8 or the power supply line 9 in considering the tolerance for the electrostatic discharge of the semiconductor device. However, in the present invention, it is possible to control the polarity dependencies of the overload tolerance for the electrostatic discharge in the air discharge model by a ratio of the power supply line and the ground line, which are connected to the conductors 6a to 6d in considering the tolerance for the electrostatic discharge of the semiconductor device.

In the first embodiment of the present invention, the description has been made of the case where the MOS transistor 7 is formed as the semiconductor device formed on the semiconductor substrate. However, it is possible to obtain a similar effect to that in the case of forming the MOS transistor 7 also in the case of forming a bipolar transistor as the semiconductor device. Further, the type and presence of the semiconductor device formed on the semiconductor substrate do not affect the essence of the present invention at all.

Further, in the first embodiment of the present invention, the description has been made of the case where the metal which forms the conductors is aluminum to which silicon is added. However, it is possible to obtain a similar effect to that in the case of forming the conductors of aluminum to which silicon is added also in the case of forming the conductors of other metals. Further, the types of metals which form the conductors do not affect the essence of the present invention at all.

What is claimed is:

1. A semiconductor device, comprising:
a semiconductor circuit provided on a semiconductor substrate, the semiconductor circuit having a source, a drain, a gate and a wiring connected to one of the source, the drain and the gate; and
a plurality of conductors for electrostatic discharge protection connected to one of a ground line and a power supply line and disposed over a region of the semiconductor circuit not occupied by the wiring, a ratio of a total area of the conductors disposed over the semiconductor circuit to an area of a chip occupied by the semiconductor circuit being 40% or more.

2. A semiconductor device according to claim 1; wherein the conductors are made of a metal.

3. A semiconductor device according to claim 2; wherein the metal of the conductors is formed simultaneously with a metal that constitutes the wiring of the semiconductor circuit.

4. A semiconductor device according to claim 1; wherein some of the conductors are connected to the power supply line and the rest of the conductors are connected to the ground line.

5. A semiconductor device according to claim 1; wherein the wiring of the semiconductor circuit and the conductors are made of a same metal layer.

6. A semiconductor device comprising:
a semiconductor substrate;
a semiconductor circuit disposed on the semiconductor substrate, the semiconductor circuit having a source, a drain, a gate and a plurality of wirings each connected to a respective one of the source, the drain and the gate;

a ground line;

a power supply line; and a plurality of conductors that provide electrostatic discharge protection and are disposed over a region of the semiconductor circuit not occupied by the wirings thereof, some of the conductors being connected to the ground line and the rest of the conductors being connected to the power supply line.

7. A semiconductor device according to claim 6; wherein a ratio of a total area of the conductors disposed over the semiconductor circuit to an area of a chip occupied by the semiconductor circuit is 40% or more.

8. A semiconductor device according to claim 6; wherein the conductors are made of a metal.

9. A semiconductor device according to claim 8; wherein the metal of the conductors is formed simultaneously with a metal that constitutes the wirings of the semiconductor circuit.

10. A semiconductor device according to claim 6; wherein the wirings of the semiconductor circuit and the conductors are made of a same metal layer.

* * * * *

UNITED STATES PATENT AND TRADEMARK OFFICE
CERTIFICATE OF CORRECTION

PATENT NO.      : 7,606,012 B2                                      Page 1 of 1
APPLICATION NO. : 11/374818
DATED           : October 20, 2009
INVENTOR(S)     : Sumio Koiwa It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 632 days.

Signed and Sealed this

Fifth Day of October, 2010

David J. Kappos
*Director of the United States Patent and Trademark Office*